United States Patent

Kirihata et al.

[11] Patent Number: 6,141,267
[45] Date of Patent: Oct. 31, 2000

[54] DEFECT MANAGEMENT ENGINE FOR SEMICONDUCTOR MEMORIES AND MEMORY SYSTEMS

[75] Inventors: Toshiaki Kirihata, Poughkeepsie; Louis Lu-Chen Hsu, Fishkill; Chandrasekhar Narayan, Hopewell Junction, all of N.Y.

[73] Assignee: International Business Machines Corporation, Armonk, N.Y.

[21] Appl. No.: 09/243,645

[22] Filed: Feb. 3, 1999

[51] Int. Cl.⁷ .................................. G11C 7/00; G11C 5/02
[52] U.S. Cl. .............................. 365/200; 365/51; 365/52; 365/185.09
[58] Field of Search .............................. 365/200, 185.09, 365/230.03, 201, 51, 52

[56] References Cited

U.S. PATENT DOCUMENTS

| | | | |
|---|---|---|---|
| 4,719,601 | 1/1988 | Gray et al. | 365/210 |
| 5,469,390 | 11/1995 | Sasaki et al. | 365/200 |
| 5,621,690 | 4/1997 | Jungroth et al. | 365/200 |
| 5,691,952 | 11/1997 | Sasaki et al. | 365/230.08 |
| 5,831,913 | 11/1998 | Kirihata | 365/200 |
| 5,907,515 | 5/1999 | Hatakeyama | 365/200 |
| 5,953,745 | 9/1999 | Lattimore et al. | 365/200 |

FOREIGN PATENT DOCUMENTS 89-269299  10/1989  Japan.

Primary Examiner—Son Mai
Attorney, Agent, or Firm—H. Daniel Schnurmann

[57] ABSTRACT

A defect management engine (DME) for memories integrates a plurality of redundancy data cells and a plurality of redundancy address cells in the same array. The redundancy data cells are used for replacing defective cells in the memories. The redundancy address cells store the addresses of the defective cells. The memories are preferably subdivided into a plurality of domains. A plurality of defective cells in each domain are supported by a plurality of repair units, each consisting of one or more redundancy data bits and redundancy address bits in the DME. When one or more data bits are read from a domain in the memory, the corresponding wordline in the DME simultaneously activates a plurality of repair units coupling to the wordline (self-contained domain selection). The redundancy data bits and the redundancy address bits are also read from the redundancy data cells and redundancy address cells, respectively. The DME logic detects whether or not the redundancy address bits match or do not match the address inputs of each repair unit (self contained redundancy match detection). This couples either redundancy data bits from the DME (i.e., a matching condition) or the data bits from the domain in the memories (i.e., a no match condition) to the corresponding DQ (self-contained redundancy replacement). The DME enables an integrated redundancy means (self-contained domain selection, self-contained redundancy match detection, and self-contained redundancy replacement). Single bit replacement, multi-bit replacement, line replacement, and variable bit size replacement are discussed. Finally, an extension of the DME concept to a memory system is also discussed.

53 Claims, 18 Drawing Sheets

DEFECT MANAGEMENT ENGINE FOR SEMICONDUCTOR MEMORIES AND MEMORY SYSTEMS

FIELD OF THE INVENTION

This invention relates, generally, to semiconductor memory devices and, more particularly, to a method and apparatus for relieving defects present in these memory devices by way of a defect management engine.

BACKGROUND OF THE INVENTION

CMOS technology has evolved at such a brisk pace that the computer market has rapidly opened to a wide range of consumers. Today multi-media computers require at least 32 MB, which increases the relative cost of the memories within the computer. In the near future, 64 MB or 128 MB computers will become commonplace, which suggests a potentially strong demand for 256 Mb DRAMs (Dynamic Random Access Memory) and beyond. Despite the huge size of the memory arrays and the lithographic difficulties that ensue, it is even more important than ever to increase the yield of the memory devices and memory system containing a plurality of the DRAMs. Process engineers constantly struggle to reduce, and ultimately eliminate defects to improve yields. Faults which will inevitably remain in the chips and system, are generally overcome using special circuit designs, most notably, redundancy replacement configurations.

An on-chip redundancy architecture which is commonly used for low density DRAMs is shown in FIG. 1(a). This configuration assigns a limited number of redundancy rows and redundancy columns to each block, which are then used within each corresponding sub-block. This intra-block replacement configuration, however, increases the redundancy area overhead as the number of sub-arrays increases in high-density DRAMs, since each block must be provided with at least one or, preferably, two redundancy elements (REs). The effectiveness of the redundancy elements is poor because of its inherent inflexibility, further reducing the chip yield when faults are clustered in a certain sub-block. This intra-block replacement is described in the article by T. Kirihata et al., entitled "A 14 ns 4 Mb DRAM with 300 mW Active Power", published in the IEEE Journal of Solid State Circuits, vol. 27, pp. 1222–1228, September 1992.

Another on-chip redundancy architecture, which was primarily developed for high-density DRAMs is shown in FIG. 1(b), in which all the redundancy elements are clustered in one redundancy array. These elements are used for repairing faults in several of the sub-arrays. This added flexibility allows sharing redundancy elements and control circuits among several sub-blocks, thereby significantly increasing the effectiveness of the redundancies present therein. Because of this effectiveness, it requires less redundancy elements and control circuits, while allowing good repairability especially for wordlines (WL), bitlines (BL), and column-select lines (CSL) faults. The effectiveness or flexibility of the aforementioned repair configuration is, however, limited to its use within a chip—a distinct drawback when repairing a substantial number of retention faults. More details on this flexible redundancy replacement may be found in an article by T. Kirihata et al., entitled "A Fault-Tolerant Design for 256 Mb DRAM", published in the IEEE Journal of Solid State Circuits, vol. 31, pp. 558–566, April 1996.

Semiconductor memory systems equipped with a spare or redundant chip make it possible to extend repairability to the system level. Here, a defective chip containing a defective element can be repaired with redundancy elements located in the spare chip, as shown in FIG. 1(c). The effectiveness of the memory system is drastically improved over on-chip redundancy because it allows using the chip containing the defect. However, the added requirement of an added spare chip containing complex redundancy replacement and control circuitry makes this approach costly. It is questionable whether or not the added cost can be paid off by an improvement in yield at the system level. On-chip redundancy is a lesser expensive approach and, therefore, more common to existing memory systems. A sample configuration of a system level redundancy that includes a spare or relief chip is described in Japanese Patent Document No. JP-A-1-269229 and in U.S. Pat. No. 5,691,952. The latter configures the chip in a plurality of 'mats', enabling to isolate the power supply from a faulty 'mat'. This approach is efficient for repairing a block fault (i.e., a large clustered fault), since designing a block redundancy in each chip (i.e., on-chip block redundancy) is generally inefficient, as was discussed in the aforementioned U.S. Pat. No. 5,691,952. A typical on-chip block redundancy is described in an article by G. Kistukawa et al., "256 Mb DRAM circuit technologies for file applications", published in the IEEE Journal of Solid State Circuits, vol. 28, pp.1105–1113, November 1993.

Sasaki, in U.S. Pat. No. 5,469,390 describes a semiconductor system wherein defects in a given chip are cured with repair elements located in some other chip. This approach is effective for relieving faults at system level, because a defective unrepairable element can be replaced with an unused redundancy element present elsewhere, when all existing repair circuits available on the chip have already been exhausted, as it is shown in FIG. 1d. This approach, however, requires more complex redundancy circuitry to enable this flexibility, thereby substantially increasing its cost. Moreover, this technique is not applicable to certain types of conventional memory modules such as SIMM (Single In-line Memory Module) or DIMM (Dual In-Line Memory Module) because all the chips within the module are generally accessed simultaneously. (Note that an I/O terminal must be used for the chip to be activated). Although an inactive chip located in a separate module can theoretically be used for system redundancy, this approach is too complex and expensive for its universal use at the system level.

Regardless whether on-chip redundancies or system level redundancies are used, the method of redundancy replacement shown in FIG. 1(e) uses redundancy elements consisting of a plurality of redundancy data cells, redundancy circuitry consisting of a plurality of redundancy address storage elements for storing an address to determine a defective element, and a plurality of redundancy match detection decoders organized as separate and independent blocks. Furthermore, within the redundancy circuitry, the redundancy address storage elements and the redundancy match detection decoders are also arranged as separate and independent blocks. This makes it difficult to effectively share the redundancy match detection decoders if the number of redundancy address storage elements is large. If the redundancy address elements are organized in a two dimensional array, it is more effective to share the redundancy match detection decoders than in a one dimensional arrangement. However, conventional redundancy address storage elements use fuses, which are difficult to arrange as an array. Even if the redundancy address storage elements are arranged in a matrix formation with non-volatile memories, such as an EPROM or EEPROM, no effective method is known for sharing the redundancy match detection decoders. In conclusion, no prior art has been identified for providing an effective method of using redundancy elements consisting of a plurality of redundant cells, redundancy circuitry consisting of a plurality of redundancy address storage elements and a plurality of redundancy match detection decoders, while improving the chip and/or the memory system yield.

OBJECTS OF THE INVENTION

Accordingly, it is an object of the present invention to link a semiconductor memory device provided with redundancy elements to a defect management engine, integrating the redundancy data cells, redundancy address cells, and redundancy match decoders in a single array.

It is a further object of the invention to have a defect management engine enable line redundancy replacement elements found in a memory device, integrating redundancy data cells, redundancy address storage elements, and redundancy match decoders in a single array.

It is still another object of the invention to enable a single-bit or multi-bit redundancy replacement elements within a memory device by way of a defect management engine, integrating redundancy data cells, redundancy address cells, and redundancy match decoders in a single array.

SUMMARY OF THE INVENTION

In one aspect of the invention, there is provided a defect management engine coupled to a main memory, the engine including: a memory array that consisting of a plurality of groups of data cells and address cells, the cells in each of the groups of data cells and address cells respectively storing data and addresses; means for accessing and reading at least one of the plurality of groups of data cells and address cells; means for detecting an address match condition for each of the accessed groups, wherein the address of the accessed group matches an address input; and means for outputting data from the accessed group of data cells when the address match condition is detected.

In another aspect of the invention, there is provided a method of managing defects that includes the steps of: configuring a memory array in a plurality of groups of data cells and address cells, the cells respectively storing data and addresses; accessing and reading at least one of the plurality of groups of data cells and address cells; detecting an address match condition for each of the accessed groups, wherein the address of the accessed group matches one of a plurality of address inputs; and outputting data from the accessed group of data cells and address cells when the address match condition is detected.

BRIEF DESCRIPTION OF THE DRAWINGS

The objects, features and advantages of the present invention will be apparent from the following description of the invention when taken in conjunction with the accompanying drawing, in which.

DETAILED EMBODIMENTS OF THE INVENTION

Figure 2:
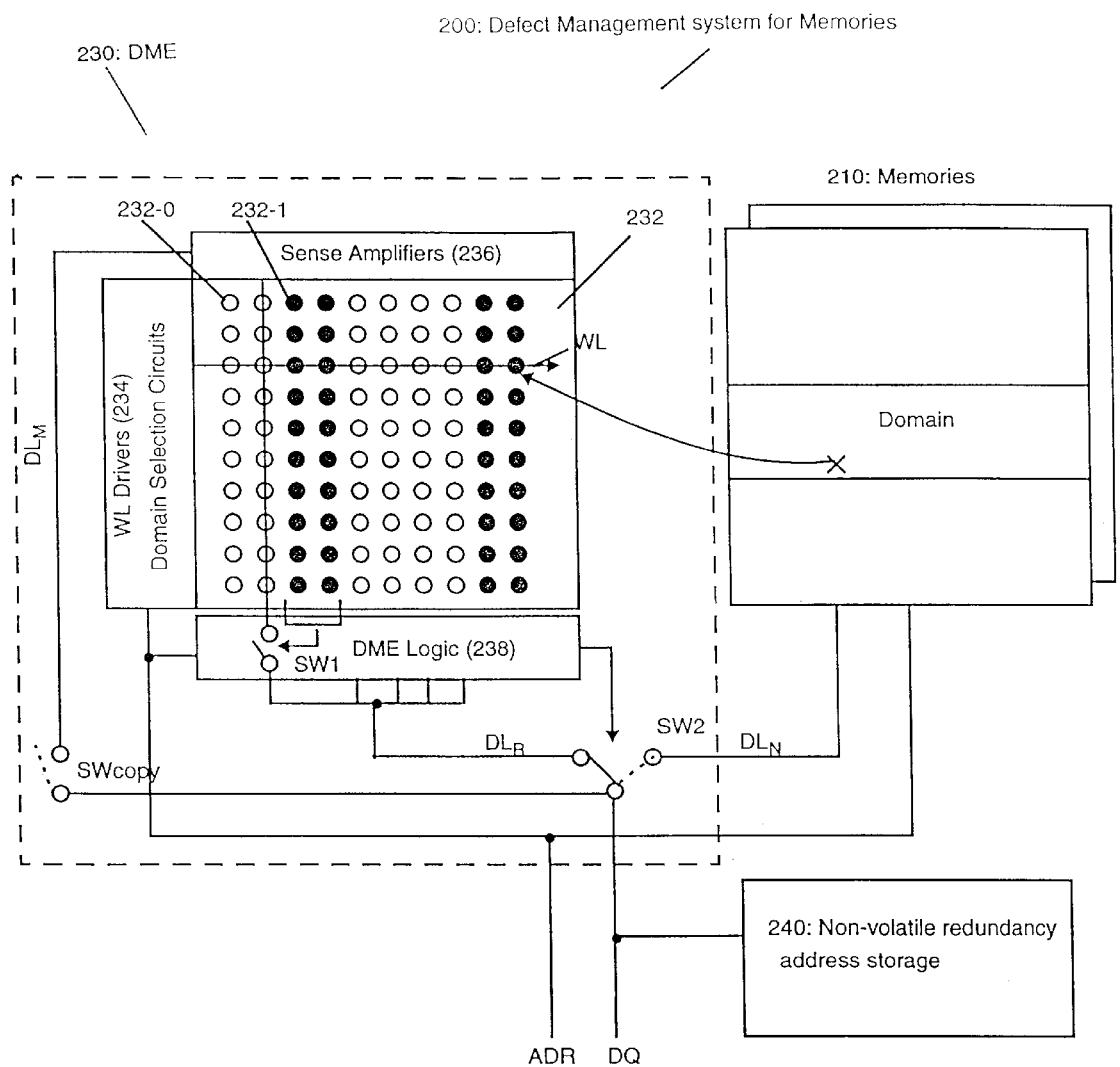
FIG. 2 is a schematic diagram of a defect management engine linked to a plurality of memories, according to the invention.

Referring now to FIG. 2, there is shown a defect management engine (DME), according to the invention, servicing a plurality of memories, these memories including any and all types of on-chip or off-chip memory devices.

Figure 1A:
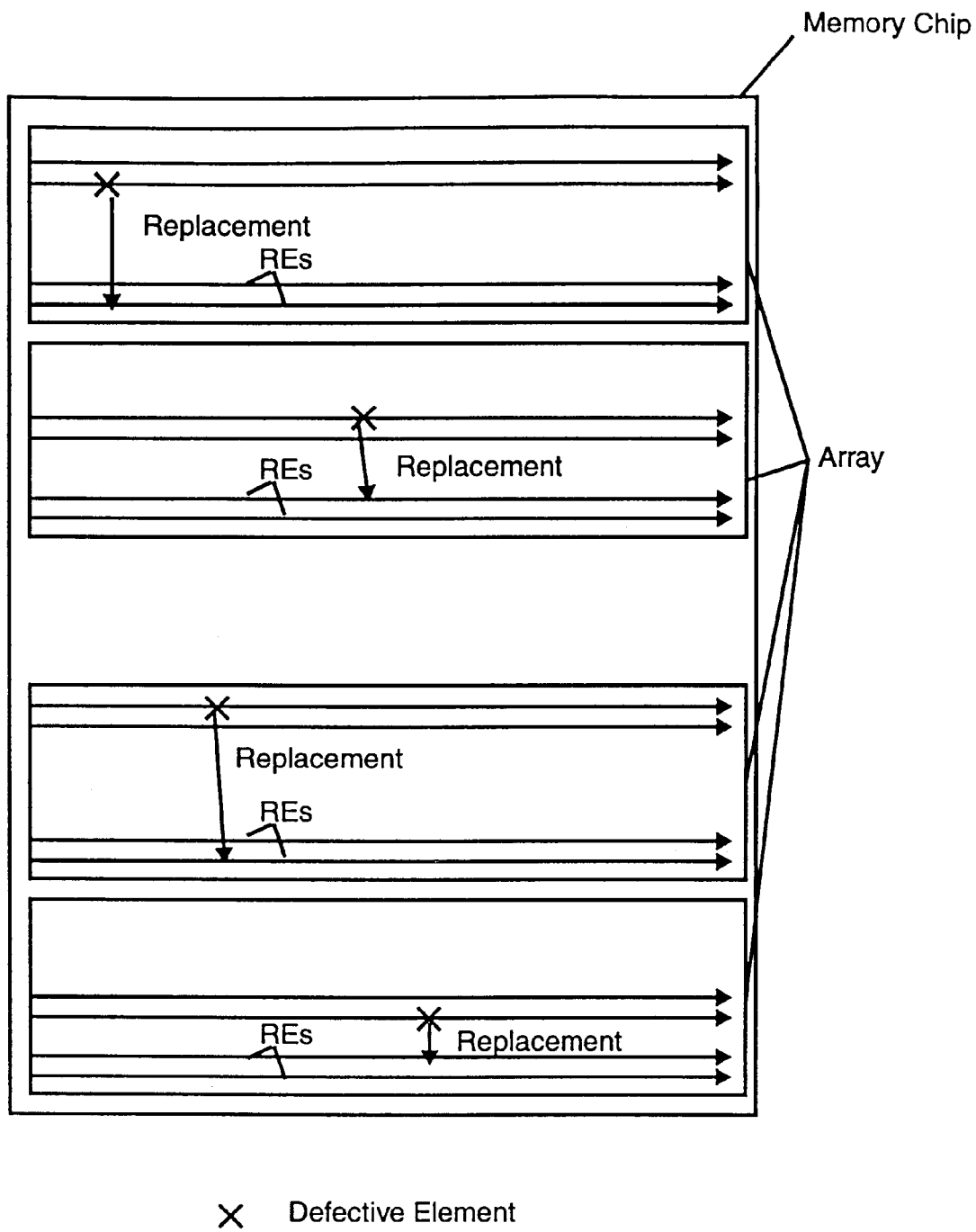
FIG. 1a illustrates a conventional on-chip redundancy replacement scheme organized in an intra-array arrangement.
Figure 1B:
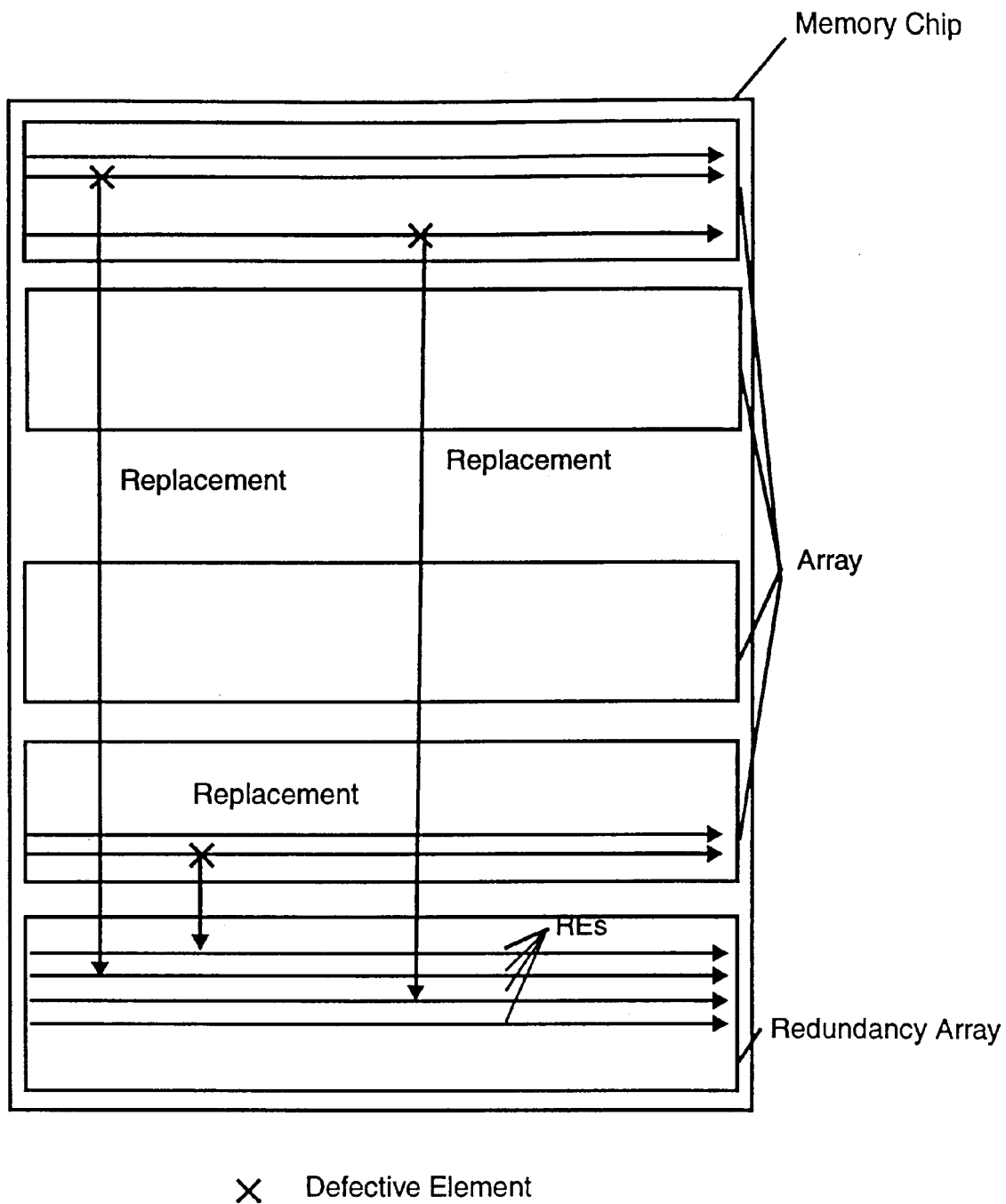
FIG. 1b illustrates a conventional on-chip redundancy replacement scheme used in a redundancy array configuration.
Figure 1C:
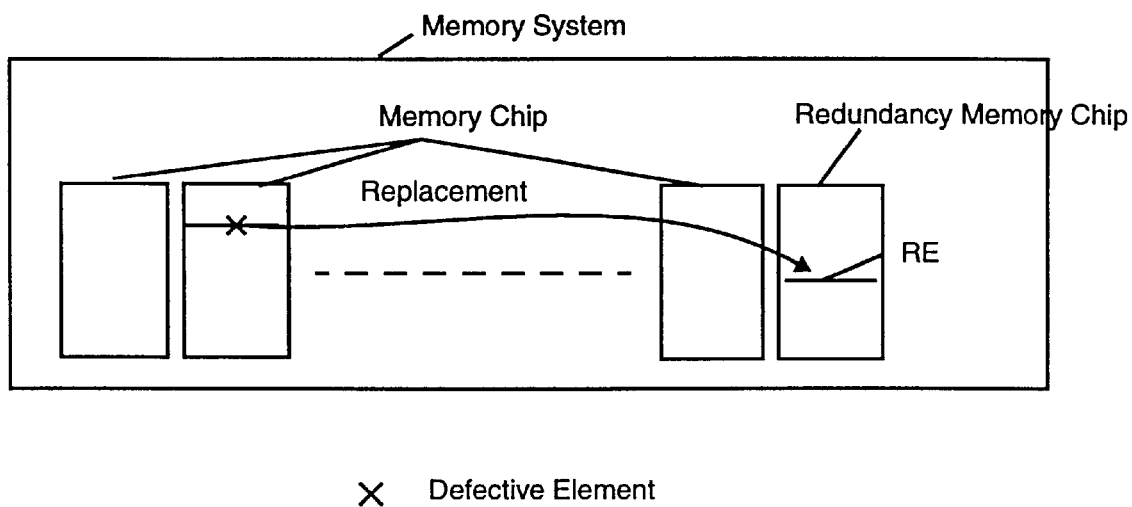
FIG. 1c is a schematic block diagram illustrating a prior art system representation that includes a plurality of redundancies linked to a redundancy memory chip.
Figure 1D:
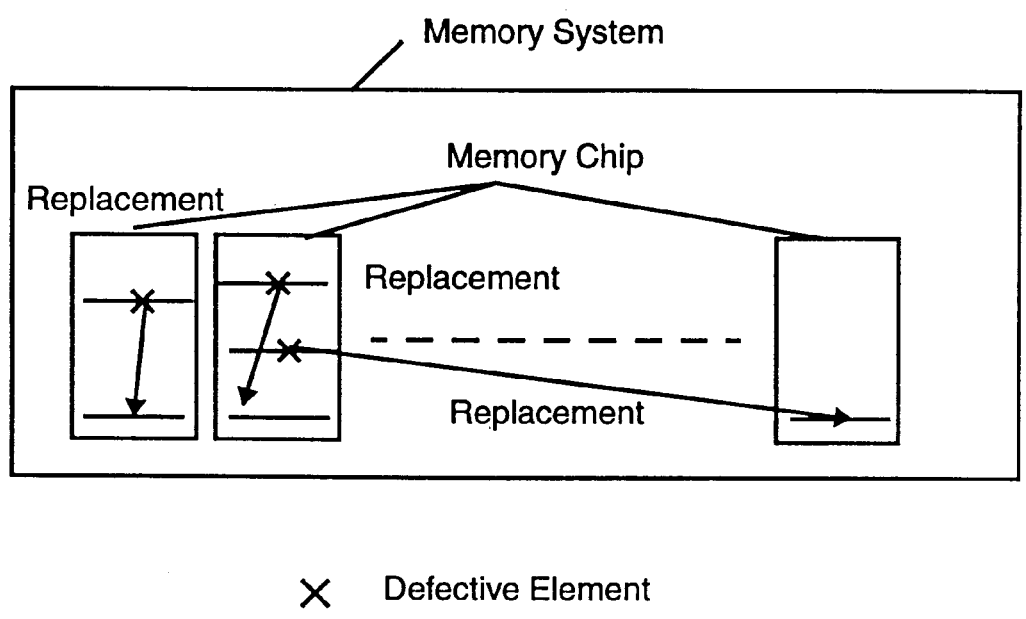
FIG. 1d is a schematic block diagram illustrating a prior art system showing redundancy elements located in other chips for curing defects in a given chip.
Figure 1E:
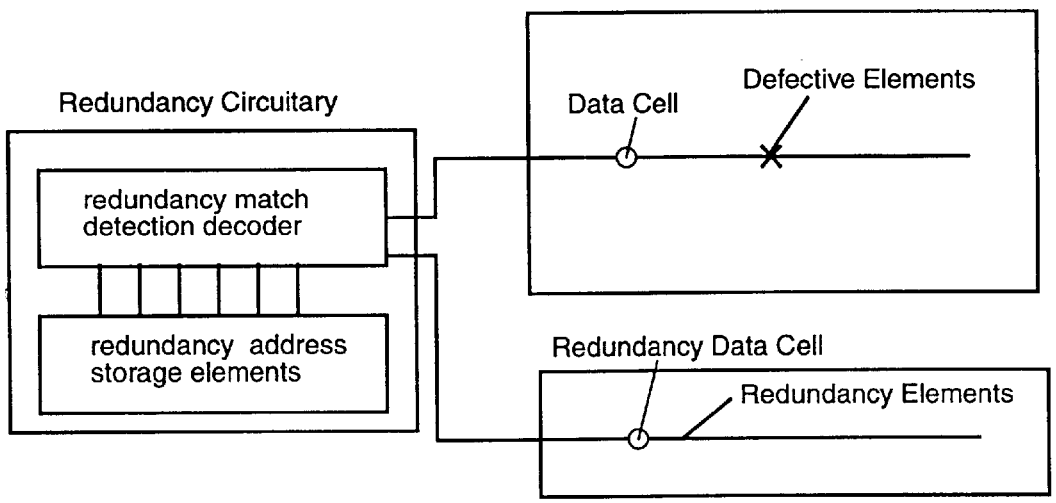
FIG. 1e illustrates a block diagram applicable to a chip or to a system showing how conventional redundancy circuitry replaces a defect.

The DME enables redundancies included therein to be advantageously used for repairing faults (labeled X) found in any domain within anyone of the memories 210. DME 230 consists of a memory array 232, wordline (WL) drivers 234, sense amplifiers 236, and DME logic 238. Unlike conventional redundancy arrays which are provided with only redundancy data cells (see FIG. 1b), the DME memory array 232 includes redundancy data cells 232-0 as well as redundancy address cells 232-1. Redundancy data cells 232-0 are used for replacing defective cells within the memories 210. The address cells 232-1, on the other hand, store the addresses which identify the location of the defective cells within the memories 210.

For convenience sake, all memories 210 are divided into a plurality of domains, the size of which are not necessarily the same. The purpose of using domains is to facilitate the enablement of a variable domain redundancy replacement. WLs in DME 230 are assigned to a given domain within the various memories 210 for handling defective cells within that domain. By assigning a different number of WLs to a corresponding domain, the repairability of the domains becomes variable, thus setting the stage for a variable number redundancy replacement per domain. WL drivers 234 activate the redundancy data cells 232-0 as well as the redundancy address cells 232-1 when a corresponding domain within the memory 210 is selected. The domain size can also be variable, allowing for a variable domain redundancy replacement. Sense amplifiers 236 amplify simultaneously the data bits from the redundancy data cells 232-0, the redundancy addresses (ADRD) from the redundancy address cells 232-1. (Note: the sense amplifiers may not be necessary in the event where the redundancy address or data cells have already sufficient cell gain, e.g., in an SRAM or EPROM). The DME logic 238 activates a self-contained redundancy match detector which compares the address inputs ADR (coupled to the DME logic 238), with a redundancy address ADRD read from the redundancy address cell 232-1. As a result, signals are generated showing a 'MATCH' (ADR=ADRD) or, conversely, a 'NO-MATCH' (ADR≠ADRD) condition. MATCH initiates a self-contained redundancy replacement by opening a first switch SW1 and transferring the redundancy data bit from the redundancy data cells 232-0 to the data-line DLR. Concurrently, a second switch SW2 couples DLR to DQ. NO-MATCH maintains SW1 in its normal closed position, and switch SW2 couples $DL_N$ (which is linked to memories 210) to DQ, in order to access to the memory.

In conclusion, the DME 230 fully integrates a plurality of redundancy circuits consisting of self-contained domain selectors by WL drivers 234, self-contained redundancy match detectors by DME logic 238, and self-contained redundancy replacements by redundancy data cells and redundancy address cells, all within a single memory chip, enabling in the process a variable number of redundancy replacements per domain; a variable domain redundancy replacement and a variable number of bit replacement.

A DME 230 can be used in conjunction with any type of memory device including a ROM, EPROM, EEPROM, FLASH-RAM, SRAM, and DRAM. Volatile memories such as for SRAM and DRAM additionally require a non-volatile redundancy address storage because the redundancy address cells 232-1 in the volatile DME 230 do not store redundancy address bits when the system 200 is powered off. Before the DME is enabled to repair a defective element present in memory 210, the redundancy addresses are copied from the memories non-volatile redundancy address storage 240 to the redundancy address cells 232-1 within DME 230 by coupling $DL_M$ to DQ through a switch $SW_{copy}$. The non-volatile redundancy address storage 240 includes any type of storage device capable of storing data in the absence of power. Examples include an EPROM, EEPROM, Flash-RAM, Hard disk, Floppy disk, and the like.

Figure 3:
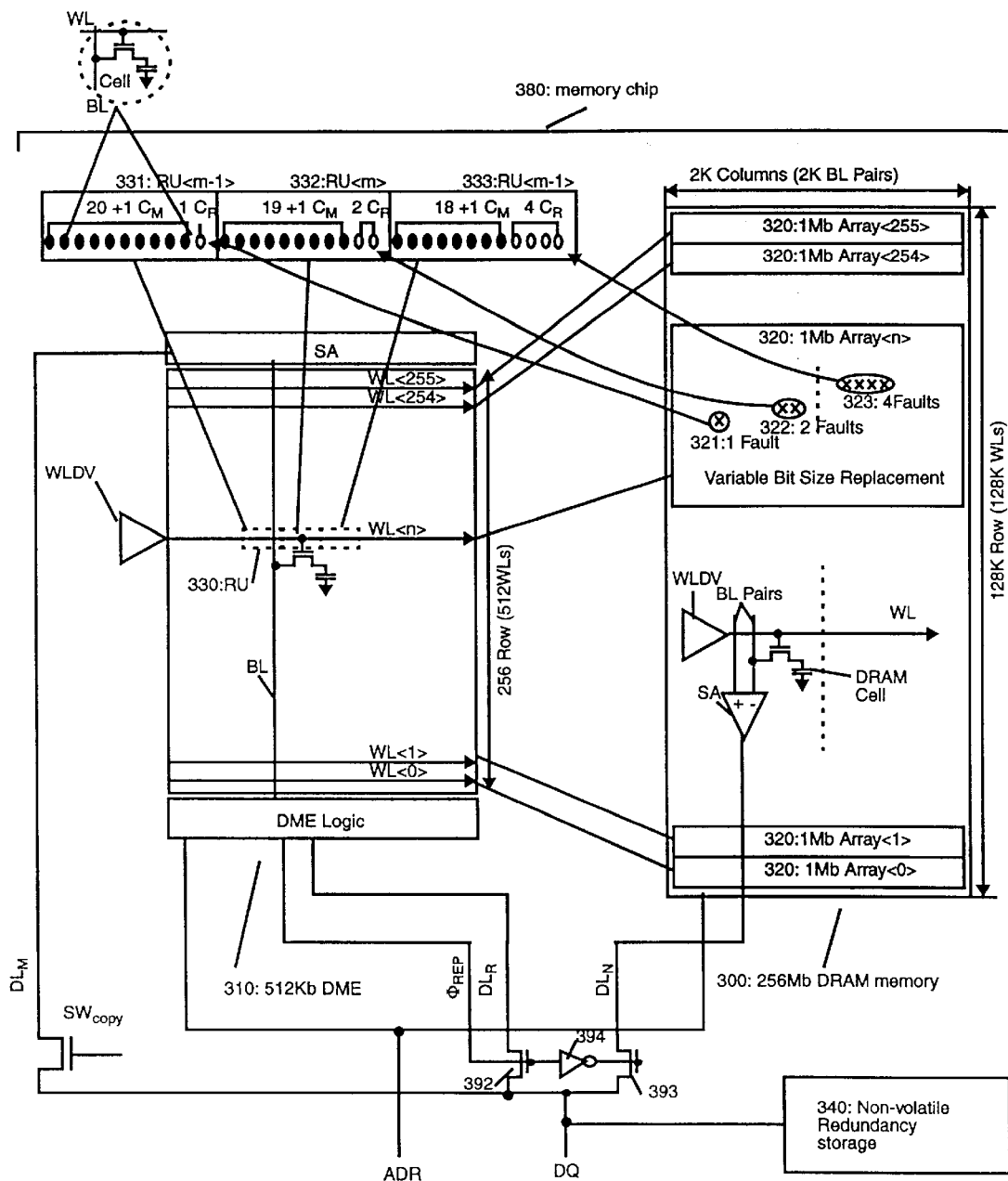
FIG. 3 is a schematic diagram of a preferred embodiment of a defect management engine applicable to a 256 Mb DRAM.

FIG. 3 shows a detailed schematic of a 256 Mb DRAM memory 300 and a 512 Kb DME 310, both integrated in a single memory chip 380. They may, if so desired, be split between two or more chips, which may include two or more 256 Mb DRAM memories 300 within the memory chip 380. Since 256 Mb DRAM memories are volatile, a non-volatile redundancy address storage 340 is added to the same memory chip, although nothing precludes it from its being incorporated in a separate chip. During or prior to power-up, the redundancy addresses are copied from a non-volatile redundancy address storage 340 to redundancy address cells in DME 310 through pin DQ and switch $SW_{copy}$.

DME 310 generates a signal $\phi_{REP}$ which opens one of two switches 392 and 393. The signal $\phi_{REP}$ remains at a binary low value while the address inputs ADR (coupled to DME 310 and to the 256 Mb DRAM memory 300) are in a NO-MATCH condition, (i.e., when no redundancy address accessed in DME 310 has been identified). When the signal $\phi_{REP}$ is at a low, (i.e., $\overline{\phi_{REP}}$, inverted by gate 394, is at a high), NMOS 393 opens, allowing memory array 300 to be read or written into by coupling $DL_N$ to DQ. The signal $\phi_{REP}$ stands at a high when the address inputs ADR MATCH the redundancy addresses accessed in the DME 310. When the signal $\phi_{REP}$ is at a high, NMOS 392 opens, allowing DME 310 to be read or written into by coupling $DL_R$ to DQ.

The 256 Mb DRAM memory 300 is structured as a matrix having 128K rows by 2K columns, wherein a row and a column are respectively defined as a wordline (WL) and a bitline (BL pair). The 256 Mb DRAM memory is further sub-divided into 256 1 Mb arrays 320. Note that 1 Mb array 320 was chosen as the preferred logical array to best explain the invention, and it is not required that it matches the physical array boundaries, such as by defining sense amplifiers or wordline drivers in the 256 Mb DRAM memory 300. Note further that each 1 Mb array is to be viewed as a domain used for replacement purposes, and it is managed by the corresponding WL in DME 310, in a manner which shall be discussed next.

The 512 Kb DME 310 is structured as a matrix having 256 rows (WLs) by 2K columns (BL pairs). 256 WLs in the engine 310 are assigned to the corresponding 1 Mb array (domain) for management purposes: WL<0> is assigned to the array<0>, WL<1> to the array<1>, ..., WL<254> to the array<254>, and WL<255> to the array<255>. Unlike conventional redundancy replacement methodology, DME 310 includes a redundancy data cell $C_R$ to store, read and write redundancy data bits, and a redundancy address cell $C_M$ to store a redundancy address bit which identifies the address of the accessed defective element present in the corresponding domain of 256 Mb DRAM memory 300. As previously discussed, the redundancy address data is copied from the non-volatile redundancy storage 340 to the corresponding $C_M$ during the power-on phase. The power-on can be detected by a voltage source transistor, which is well known in the art. Note that cells $C_R$ and $C_M$ are logic assignments which can physically be part of the same or belong to a different cell structure. A defect management unit RU, i.e., a logic unit designated for repair purposes, is designed with one or more $C_R$s and one or more $C_M$s, all of which are assigned to continuous adjacent cells along the wordline WL. Note that the number of cells 331, 332, 333 may vary from one configuration to the next. This makes it possible to have a variable bit size replacement configuration, such as 1 bit, 2 bits, 4 bits, etc., unlike typical conventional row and column redundancy configurations. The number of bits is determined by the number of $C_M$s used for redundancy addresses (+1 for enabling) and by the number of the $C_R$s used for redundant data cells in the corresponding RU. By way of example, in order to replace a single defective element, e.g., 321, within the corresponding 1 Mb array<n>, a repair unit RU<m−1> 331 consisting of 20 $C_M$ used for selecting 1 out 1M bits (+1 for enabling purposes), and 1 $C_R$ for replacing a single defective element 321 are used. Now, RU<m> 332 consisting of 19 $C_M$s, (+1 for enabling purposes) and 2 $C_R$s replaces two defective elements 322 within the 1 Mb array<n>, and RU<m+1> 333 consisting of 18 $C_M$S (+1 for enabling) and 4 $C_R$ replaces 4 defective elements 323 within the corresponding 1 Mb array<n>. As a possible option, 2 k $C_R$s are assigned for use as a WL repair since 2 k bits are fixed in the event of a wordline WL in the 256 Mb DRAM memory failing. Similarly, by increasing the number of columns to 512, a defective BL can also be repaired. The DME makes it possible to configure approximately 100 RUs within one WL, allowing some 100 to be repaired within each 1 Mb domain (or 25.6K/chip). For a 256 Mb DRAM, it represents more than 10 times the capacity of repairing than that obtained using a conventional redundancy approach. One WL<n>, consisting of one or more defect management units RUs (e.g., RU 331–333), are activated and amplified simultaneously when WL in the corresponding array<n> being used as a domain is activated by wordline driver WLDV in the 256 Mb DRAM by the same sense amplifier SA. For simplicity sake, it is assumed that only one array<n> is activated at a time in the 256 Mb array 300.

Figure 4:
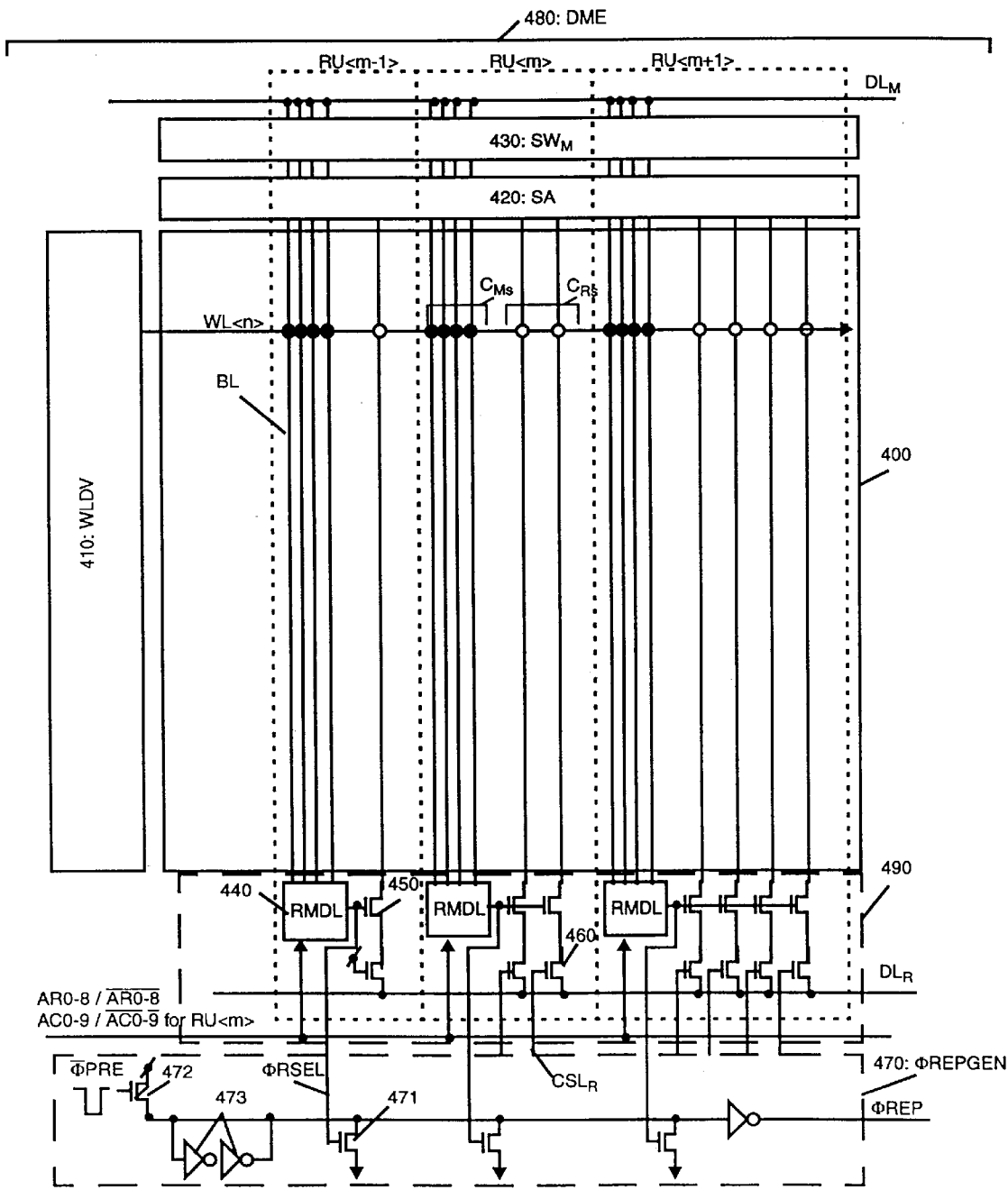
FIG. 4 illustrates a more detailed block diagram of the defect management engine shown in FIG. 2.

FIG. 4 shows a detailed schematic of the defect management engine DME 480, consisting of DRAM array 400, wordline driver block WLDV 410, sense amplifier block SA 420, write switch block $SW_M$ 430 (to service the $C_M$s), defect management logic block 490, and generator block $\phi_{REP}$GEN 470 (which generates the signal $\phi_{REP}$ which controls the necessary switches). In this example, SA 420 and $SW_M$ 430 are placed on opposite sides of the DME logic block 490 and of the generator block $\phi_{REPGEN}$ 470. This is done for illustrative purposes only, since they could equally well be placed on the same side. Each WL<n> for the corresponding domain<n> consists of one or more repair units RUs, each with the appropriate $C_M$s and $C_R$S, to enable a variable bit size replacement. When (or before) the system is powered up, DME 480 is enabled by detecting a power source voltage transition, switch $SW_M$ 430 opens, allowing the redundancy address information to be written to the $C_M$ by coupling a data line $DL_M$ to a bitline BL. During defect management operation, one of the 256 WLs corresponding to the 1 Mb domain in the 256 Mb array rises. This allows data in the $C_M$ and $C_R$ to be read by the BL pairs. This data is amplified by SAs 420 as it is conventionally done in a DRAM operation. Simultaneously, a plurality of redundancy match detection units RMDL 440 receives row address inputs AR0-8 and the complement inputs $\overline{AR0-8}$, bearing the same address as the one used for decoding one of 512 WLs in the corresponding 1 Mb array in the 256 Mb DRAM memory 300 (FIG. 3). This allows each RMDL 440 to compare the row address inputs AR0-8 to the redundancy row address stored in the $C_M$s designed to store the redundancy address (or, more particularly, the redundancy row and column addresses in the event of an address multiplexing configuration), which were already amplified by the sense amplifiers SA 420.

The following discussion describes the operation of a replacement unit, e.g., RU<m>.

When column address inputs $\overline{AC0-9}$ and complement inputs AC0-9 are provided to a plurality of RMDL 440, then each RMDL 440 in RU<m> compares these inputs with the redundancy column address stored in the remaining redundancy address cell $C_M$s. When both, the row and column address inputs, match the redundancy address bits stored in $C_M$S, signal $\phi_{RSEL}$ switches to a high value, closing switch 450, coupling BL to $DL_R$ for the appropriate $C_R$. This allows $C_R$ to be read or written into. For a 2-bit replacement, column select line $CSL_R$ selects one of the $C_R$ concurrently. $\phi_{REP}$GEN consists of pre-charged device 472, latch 473, and wired-OR NMOS 471, the gate of each being coupled to the corresponding $\phi_{RSEL}$. The wired-OR node $\phi_{REP}$ is pre-charged to a high value by $\overline{\phi_{PRE}}$ which discharges when at least one of the $\phi_{RSEL}$ switches to a high, when in a $C_R$ replacement mode. In summary, signal $\phi_{REP}$ switches to a high binary value only when one of the RMDL detects a $C_R$ replacement.

Figure 5:
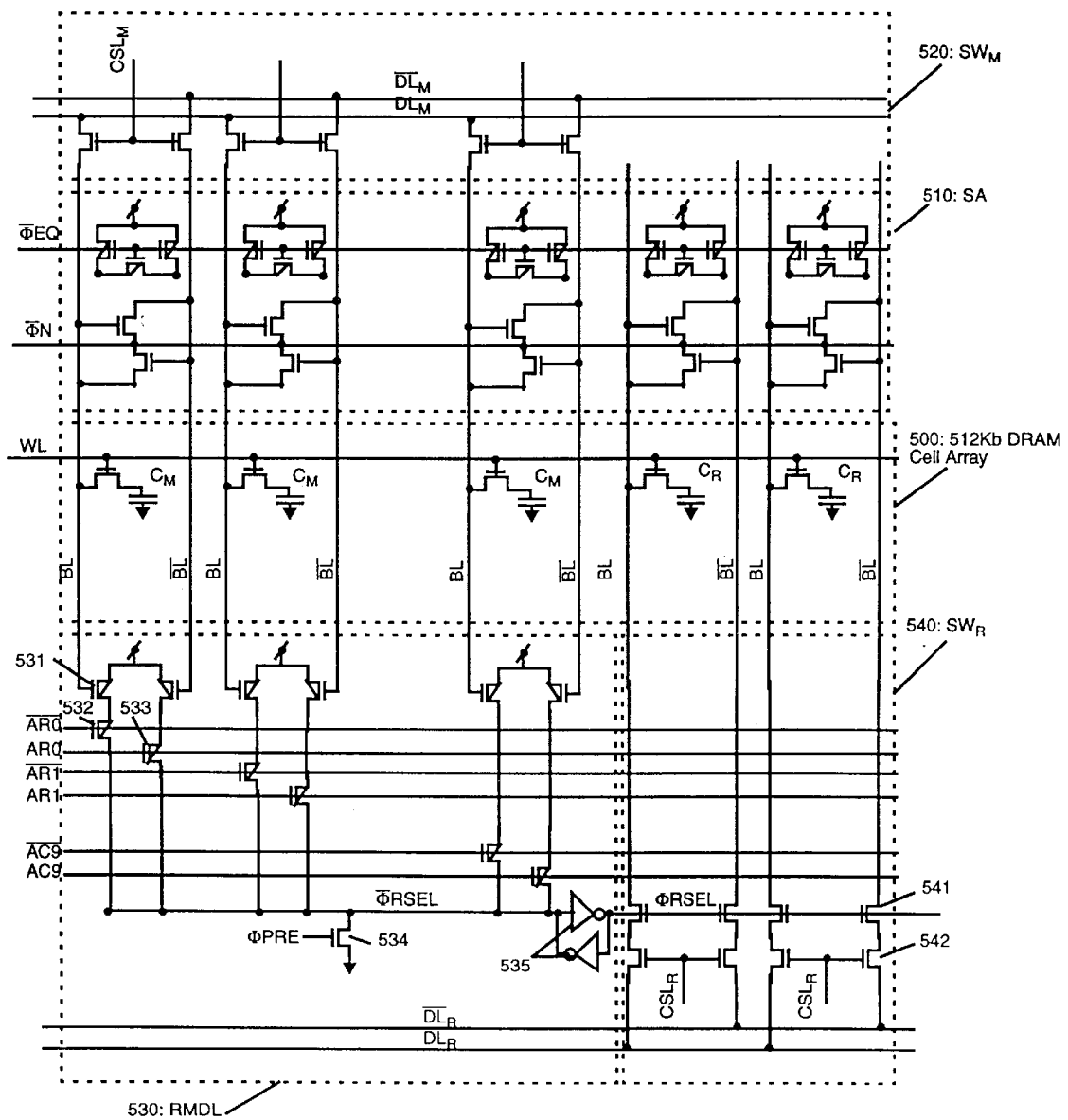
FIG. 5 illustrates a transistor implementation of the defect management engine shown in FIGS. 2 and 4.

FIG. 5 is a detailed version of the circuit used for repairing unit RU<n>, wherein a 512 Kb DRAM cell array 500 consisting of $C_M$ and $C_R$, NMOS SA 510, $SW_M$ 520, defect management logic consisting of RMDL 530, and switch $SW_R$ 540 is discussed. A Vdd pre-charge sensing arrangement consisting of NMOS SA 510 is assumed for this discussion; however, the concept is equally applicable to other sensing configurations. The Vdd pre-charge sensing arrangement requires either reference cell or twin cells which is known, but which, for simplicity sake, will be ignored in this discussion. During the power-on phase, WL, one for each row cycle, and $CSL_M$, one for each column cycle, of the 512 Kb DRAM array 500 is sequentially activated to copy the redundancy address bits to the corresponding $C_M$ through the data line pair $DL_M$ and $\overline{DL_M}$. This example assumes copying address bits one by one; however, two or more address bits can be copied by activating two CSLM. Their addressing set to access the corresponding WL or $CSL_M$ are controlled either externally by the memory system or internally by the chip. When the defect management engine receives a first row address, $\overline{\phi_{EQ}}$ switches to a high, disconnecting all BL pairs from power supply Vdd. One of the 512 WLs is then activated, and a corresponding SA block 510 is set, as it is typically done in a conventional DRAM operation. When the engine receives the first column address, the first WL rises, coupling the data line $DL_M$ pair (see FIGS. 2 and 4) to the first BL pair. This allows the first redundancy address bit to be written to the first $C_M$. The engine then receives the second column address, activating the second $CSL_M$, and allowing the second redundancy address to be written into the second $C_M$. The same operation continues until all $C_M$s along the first WL have been successfully written. A similar operation is repeated for other WLs until all the $C_M$s in all WLS store the appropriate redundancy addresses.

For defect management purposes, the BL pairs are also coupled to the gate of PMOS pairs 531, the sources of which are coupled to the power supply Vdd. The two PMOS 531 forming a pair are respectively coupled to PMOS 532 and PMOS 533. PMOS 532 and PMOS 533 are coupled, respectively, to the row addresses AR and column addresses AC or, stated more generally, to Ai (wherein i=R0-8 or C0-9) and complement address $\overline{Ai}$. (The addresses are assumed to be split into row addresses and column addresses to support row and column address multiplexing, if so desired). The respective drains of PMOSs 532 and of PMOS 533 are attached to the common wired NAND node $\overline{\phi_{RSEL}}$. The node $\overline{\phi_{RSEL}}$ is pre-charged to ground by NMOS 534 which, in turn, is controlled by the pulsed signal $\phi_{PRE}$. The node $\overline{\phi_{RSEL}}$ is also latched by CMOS latch 535. The signal $\overline{\phi_{RSEL}}$ is inverted by latch 535. The output $\phi_{RSEL}$ is coupled to NMOS 541. NMOS 541 is a control switch to couple the BL pair for the corresponding $C_R$ to the data-line $DL_R$ pair, when $\overline{\phi_{SEL}}$ switches to a high binary value. For a 2-bit replacement described in this example, the NMOS pair 542 is additionally coupled to the NMOS pair 541 which is selected by one of two $CSL_R$s and decoded by column address AC10 (not shown).

During management operation, one of 256 WLs corresponding to the selected domain into the 256 Mb DRAM memory rises after the BL equalizing signal $\overline{\phi_{EQ}}$ switches to a high. Cells $C_M$ and $C_R$ are coupled to the corresponding BLs. Following the signal generation, sense signal $\overline{\phi_N}$ switches to a low, activating NMOS SA 510. This allows one of the BL pairs to shift to a low, enabling one of the two PMOS forming the pair 531. Simultaneously, row addresses AR0-9 and complement addresses $\overline{AR0-9}$ are provided to RMDL 530. During column phase, signals from column addresses AC0-9 and complement addresses $\overline{AC0-9}$ are provided to RMDL 530. When both, BL and $\overline{AR}$ switch to a low, then, PMOS 531 and PMOS 532 (or 533) switch ON, pre-charging the signal $\overline{\phi_{RSEL}}$ resulting in a normal operation, $\phi_{RSEL}$ therefore switches to a low. Switching $\phi_{REP}$ to a low disables NMOS 541. When neither pair of serially connected PMOS 531 and 532 (or 533) is ON, $\phi_{REP}$ remains at a low, keeping switch NMOS 541 open and allowing the data line pair $DL_R$ to read or write into $C_R$, when the corresponding $CSL_R$ switches to a high value.

Figure 6:
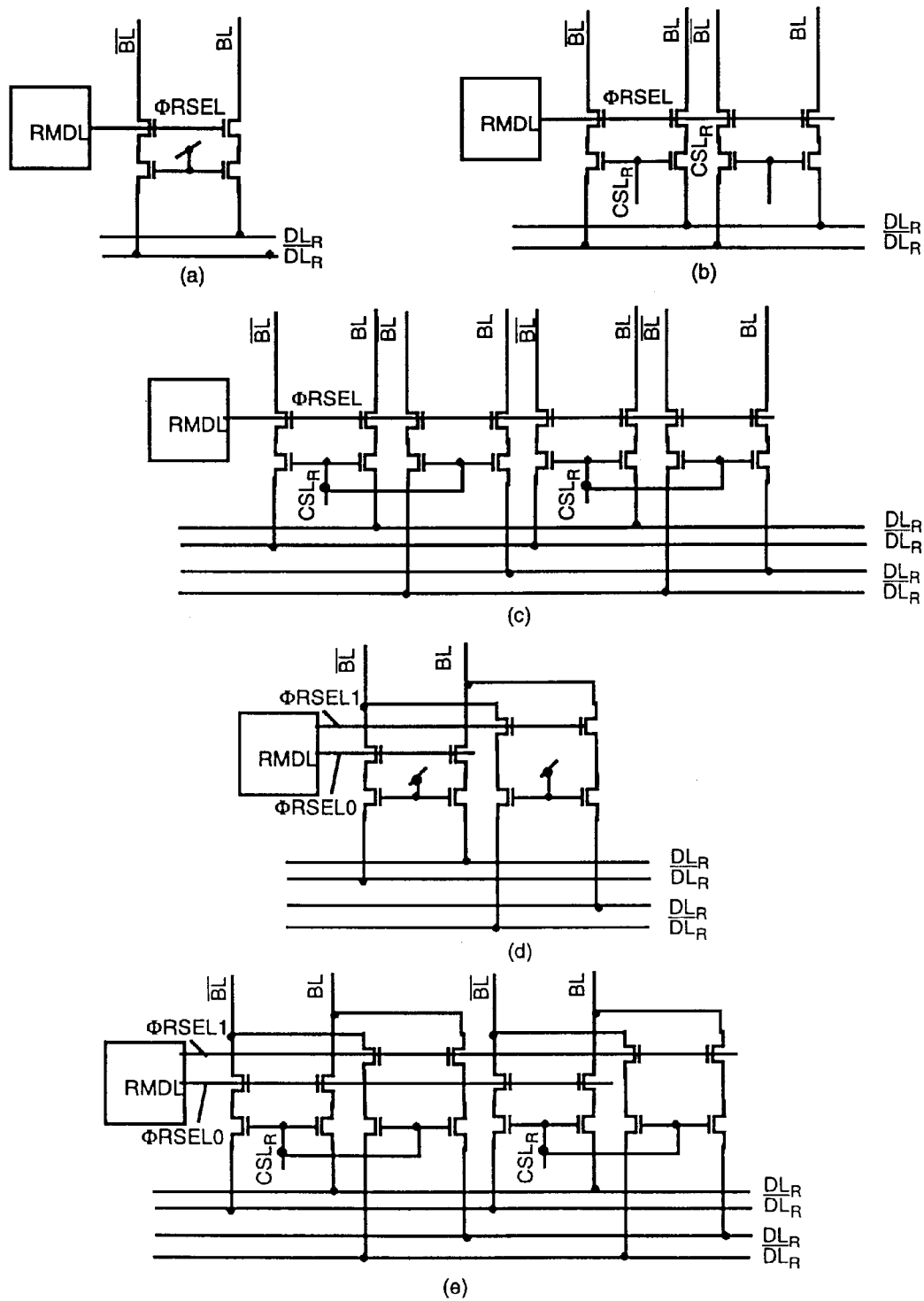
FIG. 6 illustrates a transistor implementation for enabling a variable bit size redundancy replacement configuration used in the defect management engine.
Figure 7:
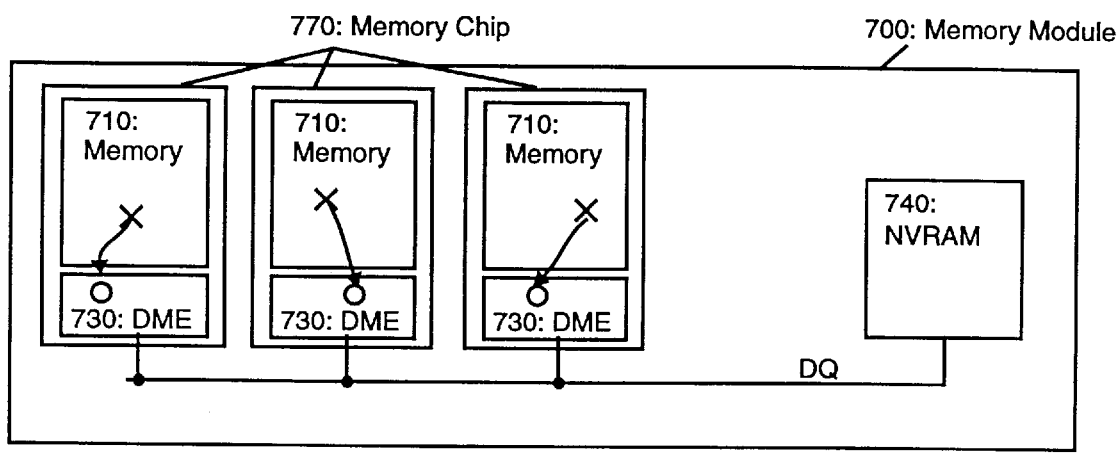
FIG. 7 shows a schematic diagram of a memory module consisting of a plurality of memory chips each containing a defect management engine (DME) for repairing a fault within a chip, the module being shown as a non-volatile RAM (NVRAM) providing a non-volatile redundancy address storage.

Various bit size replacements are possible by changing the switch block $SW_R$ 540. FIG. 6a shows a configuration of $SW_R$ for a single bit replacement. FIG. 6b shows an arrangement of $SW_R$ for a 2 bit replacement, one of which is accessed during one cycle. FIG. 6c shows a configuration of $SW_R$ for a 4 bit replacement, two of which are replaced simultaneously during one cycle. FIG. 6d shows a configuration of $SW_R$ for single bit replacement, however the bit could be used for either one of the $DL_R$ pair at a time. FIG. 6e shows a configuration of $SW_R$ for a hybrid approach enabled by a combination of the arrangements shown in FIGS. 6c–d. By combining these $SW_M$ configurations within one or more WLs, the DME makes it possible to realize a flexible replacement, which was not previously possible in existing prior art.

FIGS. 7–12 are schematic diagrams of a memory module consisting of a plurality of memory chips, at least one DME, and at least one NVRAM for a defect management engine within the module. Herein, by memory module it is to be understood as a Single In-line Memory Module (SIMM), a Dual In-line Memory Module (DIMM), or any other memory module used in personal computers, work stations, servers, and the like. The memory module 700 consists of a plurality of memory chips 770, each consisting of a memory 710 and a DME 730. The memory module 700 also includes an Non-Volatile Random Access Memory chip (NVRAM) used as a non-volatile address storage 740. NVRAM 740 stores one or more redundancy addresses that pinpoint redundancy addresses applicable to all the memory chips 770. During power-up of the memory module, the redundancy addresses are copied from NVRAM 740 to the corresponding DME 730 which is physically located in the memory chip 770 under consideration. Following power-up, faults in any memory chips 770 on the memory module 700 are managed by the on-chip DME, as discussed previously. When no redundancy addresses are detected by the DME 730, the DME 730 initiates an output transfer to the DQ bus from the memory 710 in the memory chip 770 under consideration. A data input and output transfer from the DME 730 in memory 710 is, respectively disabled and enabled. When redundancy addresses are detected by the DME 730, the DME 730 disables the output transfer to the DQ bus from memory 710, enabling a DQ transfer from the DME 730. In conclusion, this configuration provides a redundancy replacement for repairing faults by way of an on-chip DME 730 within each memory chip 770 populating the module.

Figure 8:
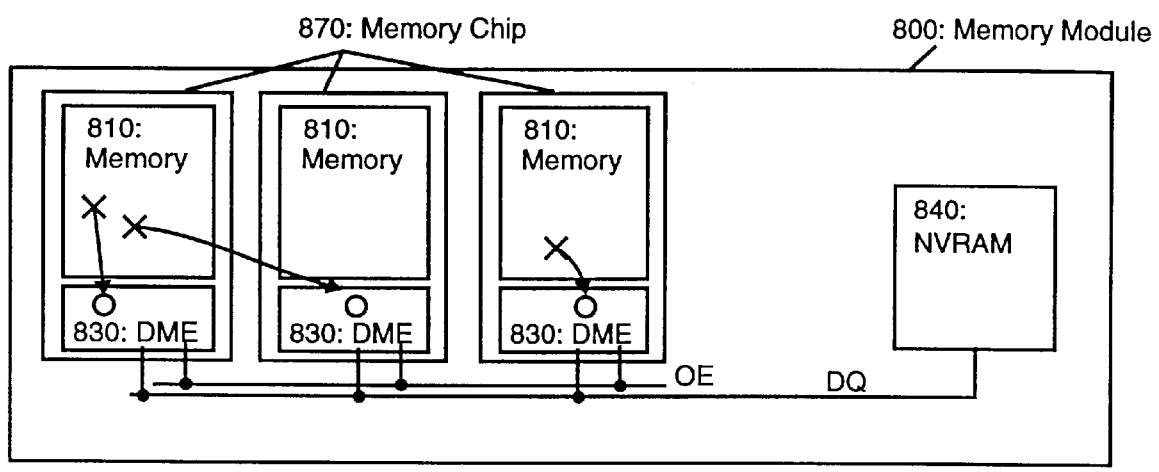
FIG. 8 shows the same memory module depicted in FIG. 7, wherein the DME located in each of the chips repairs a fault present in any of the memory chips forming the module.

FIG. 8 shows a schematic diagram of another memory module configuration with a defect management engine (DME). The memory module 800 consists of a plurality of memory chips 870, each consisting of memory 810 and DME 830. Memory module 800 also includes a non-volatile random access memory chip (NVRAM) used as a non-volatile redundancy address storage 840. In this configuration, NVRAM 840 stores one or more redundancy addresses corresponding to a plurality of addresses of defects applicable to all the memory chips 870 populating the module. When the module is powered-up, the redundancy addresses are copied from NVRAM 840 to the appropriate DME 830 physically located in the corresponding memory chip 870. Following power-up, the defects in any memory chips 870 are managed by the DME within each memory chip 870, as discussed previously with reference to FIG. 7. However, the arrangement shown in FIG. 8 allows the DME 830 in any memory chip 870 to repair faults located in any of the memory chips 870.

The following discussion assumes, for simplicity sake, that only one memory 870 in memory module 800 can be enabled, although the invention is not limited to this configuration. When redundancy addresses are not detected by any of the DMEs 830 physically located in memory chip 870, the output enable signal (OE) initiates an output transfer to the DQ bus from the corresponding memory 810 of the corresponding memory chip 870 on the memory module 800. The DQ transfer from any DMEs 830 physically located in each memory chip 870 is disabled. When redundancy addresses are detected by any one of the DMEs 830, the output enable signal (OE) disables the output transfer to the DQ bus from the corresponding memory 810 of the corresponding memory chip 870 on the memory module 800. On the other hand, a DQ transfer is enabled from the corresponding DME 830 that detected the redundancy addresses.

Thus, this arrangement provides a redundancy replacement for repairing faults within any memory chip 870 on the memory module 800 by way of DMEs 830 physically located in each chip populating the module.

Figure 9:
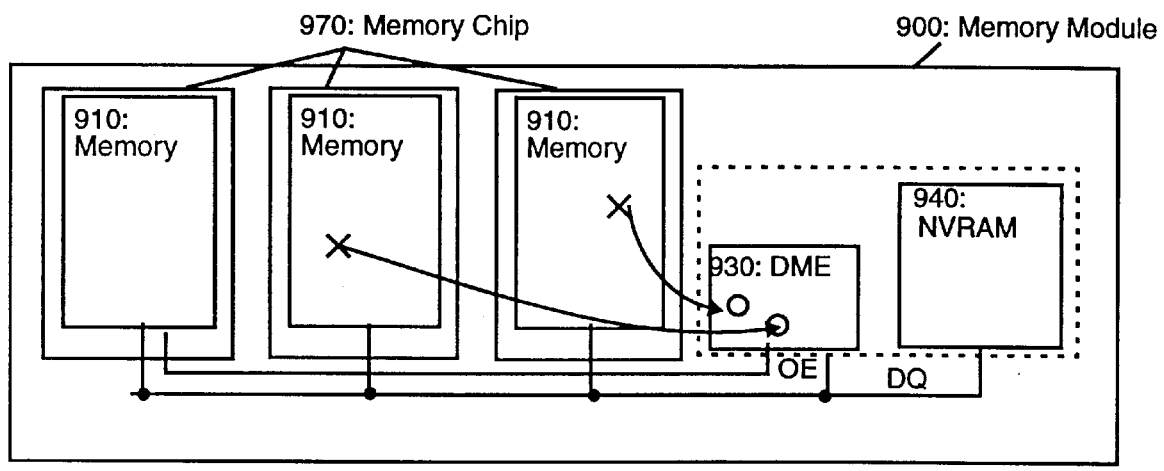
FIG. 9 shows a schematic diagram of a memory module consisting of a plurality of memory chips, a DME chip and an NVRAM chip, the DME repairing a fault present in any memory chip forming the module.

FIG. 9 shows a preferred embodiment of a memory module configuration having a separate DME chip. Unlike the a previous memory module configuration (shown in FIG. 8), the memory module 900 consists now of a plurality of memory chips 970, a DME chip 930, and a NVRAM chip 940 used as a non-volatile redundancy address storage. When the memory module is powered-up, the redundancy addresses are copied from the NVRAM chip 940 to the DME chip 930. The NVRAM chip 940 stores one or more redundancy addresses pinpointing redundancy addresses applicable to all the memory chips 970 populating the module. Following power-up, faults in any memory chip 970 on the memory module 900 are managed by the DME chip 930. If no redundancy addresses are detected by the DME chip 930, the output enable signal (OE) initiates an output transfer to the DQ bus from the corresponding memory chip 970 or from all the memory chips 970 on the memory module 900. A DQ transfer from the DME chip 930 is disabled. When redundancy addresses are detected by the DME chip 930, the output enable signal (OE) disables the output transfer to the DQ bus from the corresponding memory chip 970 or from all the memory chips 970 on the memory module 900. On the other hand, the DQ transfer from the DME 930 is enabled.

Accordingly, this arrangement provides a redundancy replacement by way of a DME chip 930 to repair faults located in any of the memory chips 970 on the memory module 900. Optionally, two or more DME chips can be arranged on the memory module 900, if required.

Figure 10A:
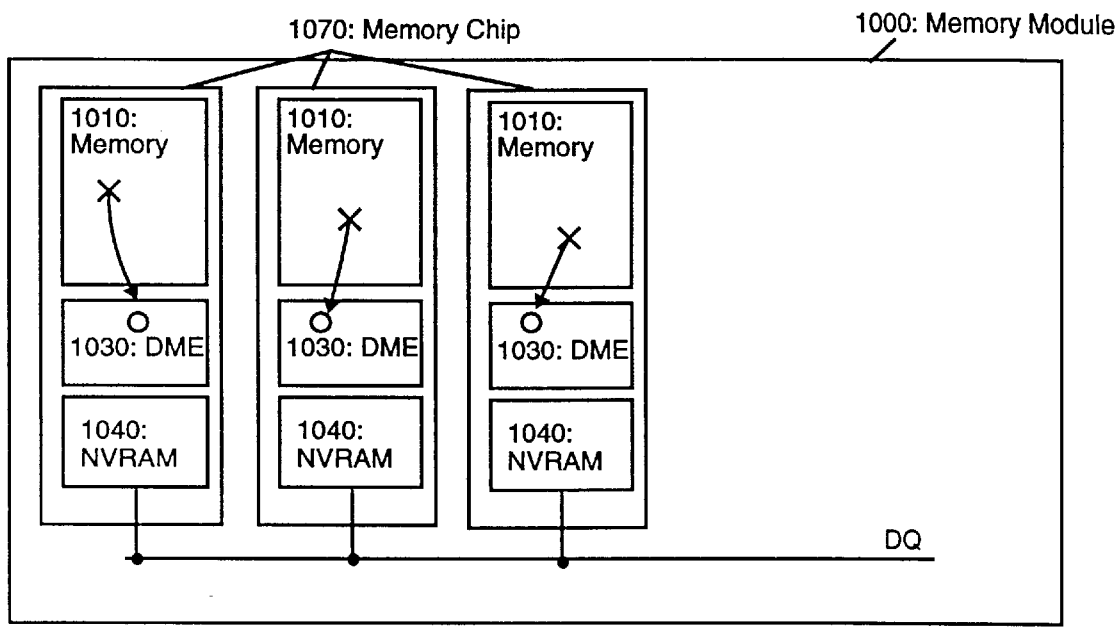
FIG. 10a is a schematic diagram of a memory module consisting of a plurality of memory chips, each including a DME and an NVRAM to repair a fault within the chip.

FIG. 10a still shows a schematic diagram of still another memory module configuration having a DME. The memory module 1000 consists of a plurality of memory chips 1070, each consisting of a memory 1010, an on-chip DME 1030, and an on-chip NVRAM 1040. When the memory module is powered-up, the redundancy addresses are copied from the on-chip NVRAM 1040 to the on-chip DME 1030 located in each memory chip 1070. Following power-up, all the defects in any of the memory chips 1070 are managed by the DME located in each memory chip, as it was discussed previously. When redundancy addresses are not detected by the on-chip DME 1030, the DME enables the output transfer to the DQ bus from the memory section 1010 on the memory chip 1070. The DQ transfer from the on-chip DME 1030 is disabled. When redundancy addresses are detected by the on-chip DME 1030, the on-chip DME 1030 disables the output transfer to the DQ bus from the memory 1010. On the other hand, the DQ transfer from the DME 1030 is enabled.

In conclusion, this approach can provide a redundancy replacement in each chip, repairing a fault with an on-chip DME 1030 and an on-chip NVRAM 1040 within each memory chip 1070.

Figure 10B:
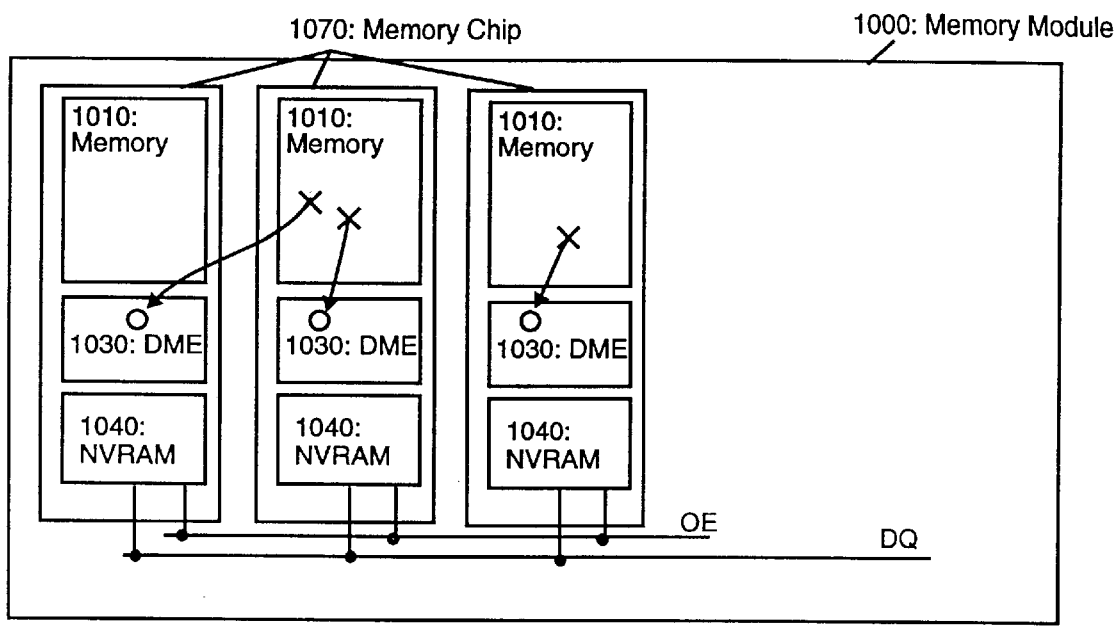
FIG. 10b is a schematic diagram of a memory module consisting of a plurality of memory chips, each including a DME and an NVRAM to repair a fault in any memory chip forming the module.

FIG. 10b shows a schematic diagram of yet another embodiment of a memory module configuration with the DME. The memory module 1000 consists of a plurality of memory chips 1070, each consisting of a memory 1010, an on-chip DME 1030, and an on-chip NVRAM 1040. When the memory module is powered-up, the redundancy addresses are copied from the on-chip NVRAM 1040 to the on-chip DME 1030 in each memory chip 1070. Following power-up, a defect in which each memory chip 1070 on the memory module 1000 is managed by the DME physically located in any memory chip 1070. This configuration is similar to that shown in FIG. 10a. However, FIG. 10b differs in that it allows the on-chip DME 1030 in memory chip 1070 repair faults in any one of the memory chips 1070. For simplicity sake, the following discussion assumes that only one memory 1070 on the memory module 1000 can be enabled. When redundancy addresses are not detected by any on-chip DMEs 1030 physically located in a memory chip 1070, the output enable signal (OE) enables the output transfer to the DQ bus from the memory 1010, of the corresponding memory chip 1070 on the memory module 1000. A DQ transfer from any DME 1030 physically located in each memory chip 1070 is disabled. When redundancy addresses are detected by any one of on-chip DMEs 1030, the output enable signal (OE) disabling the output transfer to the DQ bus from the corresponding memory 1010 on the memory module 1000. On the other hand, a DQ transfer is enabled from the corresponding on-chip DME 1030 which detected the redundancy addresses.

This configuration provide a redundancy replacement by way of on-chip DMEs 1030 physically located in a different chip to repair a fault in any of the memory chips 1070 on the module 1000, while integrating on-chip NVRAM 1040 in each memory chip 1070.

Figure 11:
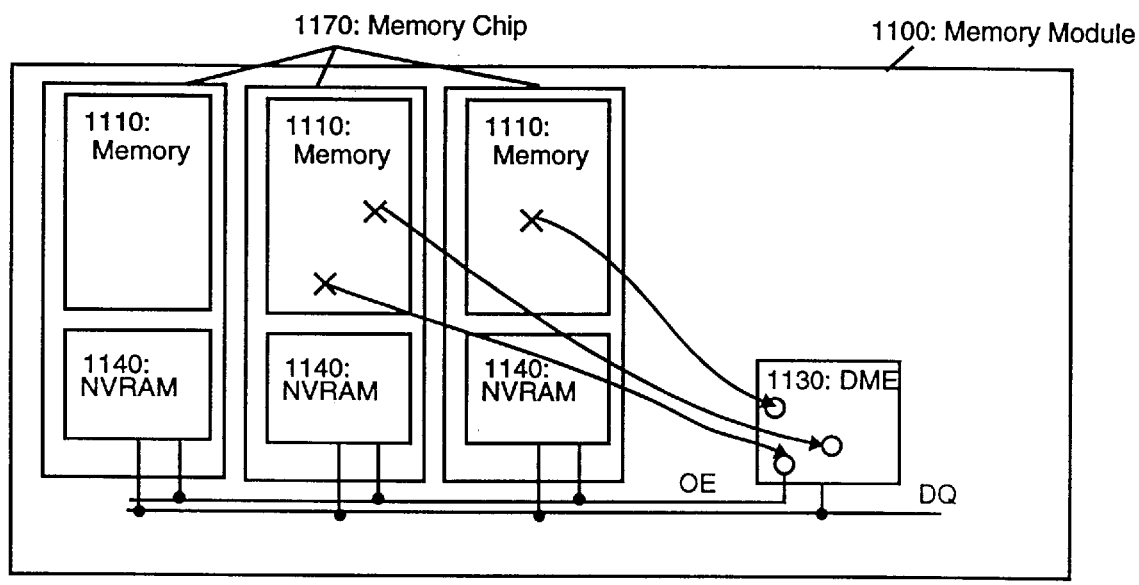
FIG. 11 shows a schematic diagram of a memory module consisting of a plurality of memory chips, each including an NVRAM, and a DME chip to repair a fault in any memory chip forming the module.

FIG. 11 shows a schematic diagram of still another embodiment of a memory module configuration having a DME. The memory module 1100 consists of a plurality of memory chips 1170, each consisting of memory 1110, and an on-chip NVRAM 1140. The memory module 1100 also contains a DME chip 1130, which manages faults in any of the memory chips 1170 in the memory module 1100. When a memory module is powered-up, the redundancy addresses are copied from the on-chip NVRAM 1140 on each memory chip 1170 to the DME chip 1130. Following power-up, any defect in any memory chip 1170 on the memory module 1100 is managed by the DME chip 1130. When redundancy addresses are not detected by the DME chip 1130, the output enable signal (OE) enables the output transfer to the DQ bus from the corresponding memory chip 1170 or from any of the memory chips 1170 on the module 1100. A DQ transfer from the DME chip 1130 is disabled. When redundancy addresses are detected by the DME chip 1130, an output enable signal (OE) disables the output transfer to the DQ bus from the corresponding memory chip 1170 or from all the memory chips 1170 on the memory module 1100. On the other hand, a DQ transfer is enabled from the DME chip 1130.

Thus, this configuration can provide a redundancy replacement with DME chip 1130 repairing a fault in any memory chip 1170, each integrating an NVRAM chip as a non-volatile redundancy address storage in memory module 1100.

Although the embodiments illustrated in FIGS. 7–11 use either an on-chip NVRAM or a separate NVRAM chip, practitioners in the art will fully understand that a MASK ROM, EPROM, EEPROM, flash memory, hard-disk, CD-ROM, fuses or any combinations of the above can be used as a non-volatile redundancy address storage 1140. The invention can also advantageously include an exchangeable redundancy address storage such as a floppy disk, or an IC card acting as a redundancy address storage. By substituting the exchangeable redundancy address storage, a memory system, and in particular, a partially good memory system can be reconfigured, the details of which are discussed next.

Figure 12:
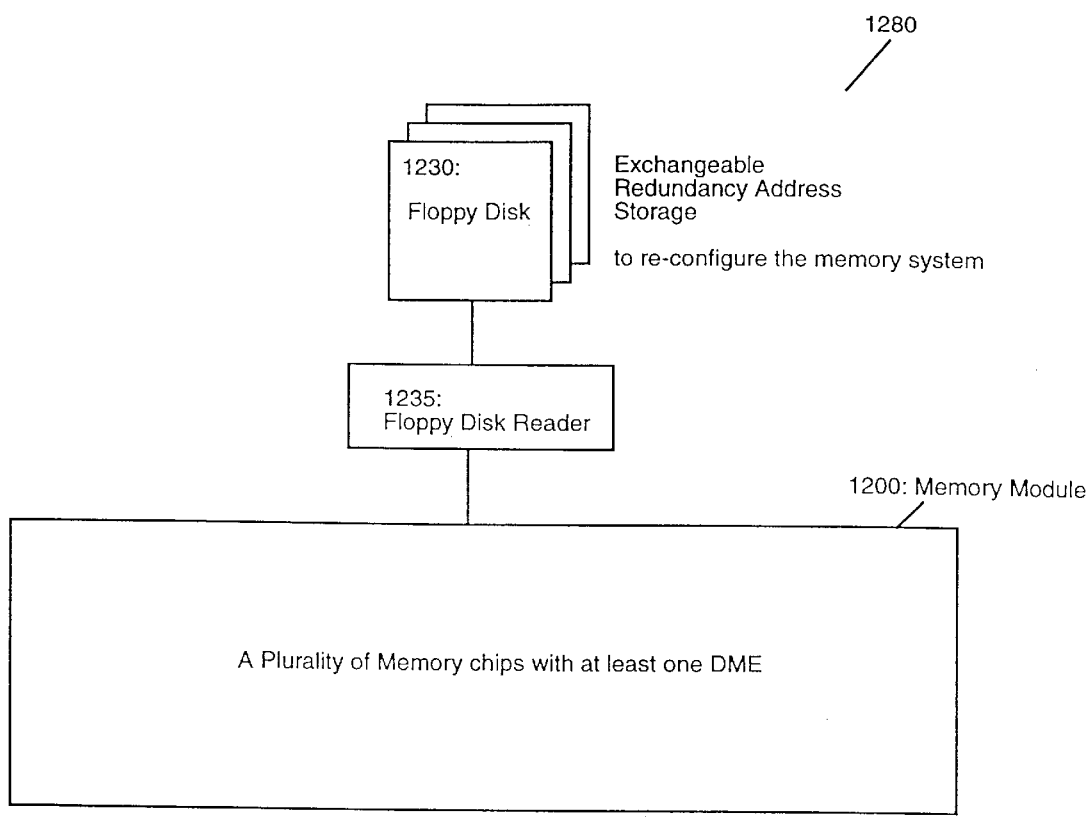
FIG. 12 shows a schematic diagram of a memory system consisting of a floppy disk as an exchangeable non-volatile redundancy address storage, a floppy disk reader, and a memory module consisting of a plurality of memory chips and at least one defect management engine.

FIG. 12 shows a schematic diagram of a memory system 1280 consisting of memory module 1200, floppy disk 1230 as an exchangeable redundancy address storage, and floppy disk reader 1235. The memory module further includes at least one DME to repair faults found in a plurality of memory chips placed on the memory module 1200. Any of the configurations applicable to the DME previously described in FIGS. 8–11 can be used for implementing the DME. When power is turned on the memory module, the floppy disk reader 1235 reads the redundancy addresses from the floppy disk 1230. These addresses are then copied to the DME 1200. Following power-up, any defect found in memory module 1200 are managed by at least one DME 1200. The advantages of this exchangeable redundancy address storage can be understood as a reconfigurable feature of the memory system since it enable a potentially partially good memory system if it meets the system requirements. In such case, a partial good memory system that includes an unrepairable fault can be used by accessing the portion of the chip which can be accessed. By way of example, assuming that a 512 MB memory system contains some unrepairable faults. If 256 MB out of the 512 MB contain no faults, the memory system can be used as a 256 MB memory system. In general, there are one or more possibilities for making a partially good entity by reorganizing the number of addressing, numbers of I/Os or banking. The requirement significantly depends on the purpose. By preparing one or more exchangeable redundancy address storage, a partially good memory system can be reconfigured.

Figure 13:
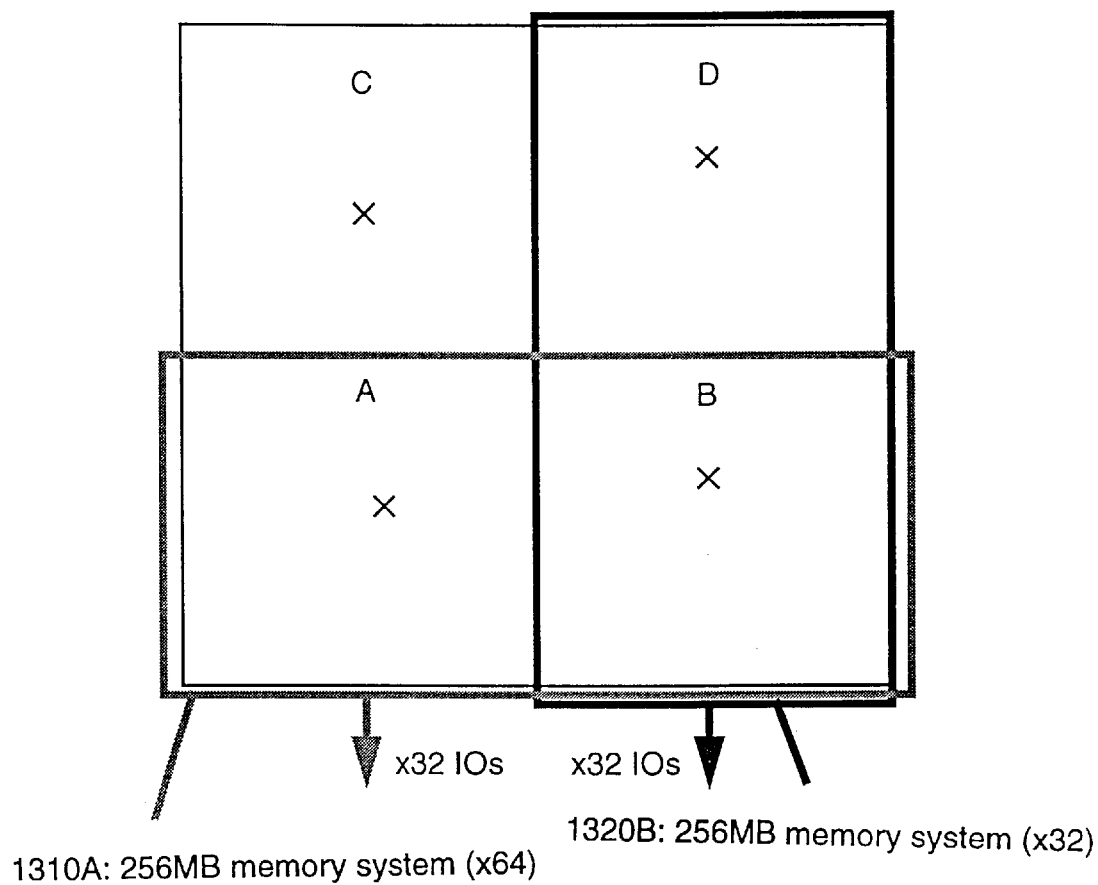
FIG. 13 illustrates a schematic diagram of a reconfigurable memory system sub-divided into four domains.

FIG. 13 illustrates a reconfigurable memory system subdivided into four domains. The memory system is provided with a DME and an exchangeable redundancy address storage.

More specifically, the 512 MB memory system 1300 contain a plurality of faults (defined by x) over spread over domains A–D. It is assumed that the DME cannot repair all four domains but, at least, it can repair any two of the four domains. This gives an opportunity of configuring the 256 MB memory system by limiting the addressing space or the number of I/O configurations. Six combinations (AB, AD, AC, BD, AD, and BC) are possible to configure the 256 MB memory system using two out of the four domains. The 256 MB memory system 1310A containing two A and B domains allows 64 I/O configurations with half the addressing space. On the other hand, the 256 MB memory system 1320B containing B and D domains allows a total of 32 with a full addressing space. The best 256 MB memory system can be configured by using a different exchangeable redundancy address storage. Note that the best configuration such as 1310A and 1320B dependent on system requirements, which can be realized by changing the exchangeable address storage without changing the memory module.

While the invention has been described in terms of several preferred embodiments, various alternatives and modifications can be devised by those skilled in the art without departing from the spirit and scope of the invention. Accordingly, the present invention is intended to embraces all such alternatives which fall within the scope of the appended claims.

What is claimed is:

1. A defect management engine comprising:
   a memory array comprising a plurality of groups of data cells and address cells, said cells in each of said groups of data cells and address cells respectively storing data and addresses;
   means for accessing at least one of said plurality of groups of data cells and address cells;
   means for detecting an address match condition for each of said accessed groups, wherein the address of said accessed group matches an inputted address; and
   means for outputting data from said accessed group of data cells when said address match condition is detected.

2. The defect management engine as recited in claim 1, further comprising at least one main memory wherein said data cells are redundancy data cells for replacing defective ones of said data cells in said at least one main memory, and said address cells are redundancy address cells for storing addresses of defective ones of data cells in said at least one main memory.

3. The defect management engine as recited in claim 1 further comprising means for overriding said accessed group of data cells respectively with new data, when said address match condition is detected.

4. The defect management engine as recited in claim 1, wherein said data cells and said address cells are selected from the group consisting of DRAM cells, EEPROM cells, Flash memory cells, and from any combination of said cells.

5. The defect management engine as recited in claim 1, wherein said data cells and said address cells are of a same cell type.

6. The defect management engine as recited in claim 1, wherein said data cells and said address cells are of a different cell type.

7. The defect management engine as recited in claim 1, wherein addresses stored in said address cells are non-volatile.

8. The defect management engine as recited in claim 1 further comprising means for programming addresses stored in said address cells.

9. The defect management engine recited in claim 2, wherein said redundancy data cells are of a same cell type as said data cells in said at least one main memory.

10. The defect management engine as recited in claim 2, wherein said redundancy data cells are of a cell type that is different from said data cells in said at least one main memory.

11. The defect management engine as recited in claim 8, wherein said means for programming replicates addresses into said address cells from a non-volatile redundancy address storage means.

12. The defect management engine as recited in claim 8, wherein said means for programming is activated during system power-up.

13. The defect management engine as recited in claim 12, wherein said system power-up is detected by a voltage source transition.

14. The defect management engine as recited in claim 8, wherein said means for programming is enabled by a command generated by a controller means.

15. The defect management engine as recited in claim 8, wherein said means for programming replicates said addresses into said address cells by sequentially activating each of said address cells.

16. The defect management engine as recited in claim 8, wherein said means for programming replicates said addresses into said address cells by simultaneously activating at least two of said address cells.

17. The defect management engine as recited in claim 11, wherein said non-volatile redundancy address storage means is selected from the group consisting of a ROM, EPROM, EEPROM, Flash RAM, hard-disk, floppy disk, and CD-ROM.

18. The defect management engine as recited in claim 2 further comprising means for enabling a single-bit and a multi-bit redundancy replacement within said at least one main memory.

19. The defect management engine as recited in claim 18, wherein said single-bit redundancy replaces a single defective one of said data cells within said at least one main memory with one group of said plurality of groups of redundancy data cells.

20. The defect management engine as recited in claim 18, wherein said multi-bit size redundancies replace multiple defective ones of said data cells within said at least one main memory with one group of said plurality of groups of redundancy data cells.

21. The defect management engine as recited in claim 18 further comprising means for enabling a variable bit size redundancy replacement in said at least one main memory.

22. The defect management engine as recited in claim 21, wherein said variable bit size redundancy replacement allows a choice for replacing defective ones of said data cells within said at least one main memory with at least two of said groups of said plurality of data cells having a different number of data cells.

23. The defect management engine as recited in claim 2 further comprising means for enabling a wordline redundancy replacement in said at least one main memory.

24. The defect management engine as recited in claim 2 further comprising means for enabling a bitline redundancy replacement in said at least one main memory.

25. The defect management engine as recited in claim 2, wherein said data cells are redundancy data cells for replacing defective ones of said data cells present in at least one domain within said at least one main memory, and said address cells are redundancy address cells for addressing defective ones of said data cells within said at least one domain.

26. The defect management engine as recited in claim 25, wherein said plurality of groups of redundancy data cells and redundancy address cells is assigned to said at least one domain.

27. The defect management engine as recited in claim 25, wherein said at least one domain within said at least one main memory is supported by at least one of said plurality of groups of redundancy data cells and redundancy address cells.

28. The defect management engine as recited in claim 25 further comprising means for enabling a variable domain redundancy replacement.

29. The defect management engine as recited in claim 28, wherein said variable domain redundancy replacement is enabled by changing the size of said at least one domain within said at least one main memory.

30. The defect management engine as recited in claim 29 further comprising means for enabling a variable number of repair means in each of said domains within said at least one main memory.

31. The defect management engine as recited in claim 1, wherein said means for accessing at least one of said plurality of groups includes wordline drivers.

32. The defect management engine as recited in claim 31, wherein said means for accessing at least one of said plurality of groups further includes sense amplifiers.

33. The defect management engine as recited in claim 31, wherein said wordline driver enables means for assigning to said plurality of groups of data cells and address cells respective redundancy ones of said redundancy data cells and redundancy address cells to repair a plurality of faults in at least one of said domains.

34. A defect management engine coupled to at least one main memory comprising:
   a memory array comprising a plurality of groups of redundancy data cells and redundancy address cells, said cells in each of said groups of redundancy data cells and redundancy address cells respectively storing redundancy data and redundancy addresses;
   means for accessing at least one of said plurality of groups of redundancy data cells and redundancy address cells;
   means for detecting a redundancy address match condition for each of said accessed groups, wherein the redundancy address of said accessed group matches one of a plurality of inputted addresses; and
   means for outputting redundancy data from said accessed group of redundancy data cells and redundancy address cells when said redundancy address match condition is detected.

35. The defect management engine as recited in claim 34 further comprising means for overriding said accessed group of redundancy data cells with new data when said redundancy address match condition is detected.

36. The defect management engine as recited in claim 34, wherein said redundancy data cells and said redundancy address cells are selected from the group consisting of DRAM cells, EEPROM cells, and Flash memory cells.

37. The defect management engine as recited in claim 34, wherein said redundancy data cells and said redundancy address cells are of a same cell type.

38. The defect management engine as recited in claim 34, wherein said redundancy data cells and said redundancy address cells are of a different cell type.

39. A defect management system comprising a plurality of memory chips, and at least one defect management engine chip coupled to each of said memory chips, said at least one defect management engine chip comprising:
   a memory array comprising a plurality of groups of data cells and address cells, said cells in each of said groups of data cells and address cells respectively storing data and addresses;
   means for accessing at least one of said plurality of groups of data cells and address cells;
   means for detecting an address match condition for each of said accessed groups, wherein the address of said accessed group matches an inputted address; and
   means for outputting data from said accessed group of data cells when said address match condition is detected.

40. The defect management system as recited in claim 39 further comprising a non-volatile random access memory chip coupled to each of said memory chips.

41. A defect management system comprising a plurality of chips, each of said chips comprising at least one memory, and at least one defect management engine coupled to said at least one memory, said at least one defect management engine comprising: a memory array comprising a plurality of groups of data cells and address cells, said cells in each of said groups of data cells and address cells respectively storing data and addresses; means for accessing at least one of said plurality of groups of data cells and address cells; means for detecting an address match condition for each of said accessed groups, wherein the address of said accessed group matches an inputted address; and means for outputting data from said accessed group of data cells when said address match condition is detected.

42. The defect management system as recited in claim 41 further comprising at least one non-volatile random access memory coupled to said at least one memory and to said at least one defect management engine.

43. A defect management system comprising a plurality of chips, each of said chips comprising at least one memory, at least one non-volatile random access memory coupled to said at least one memory, and at least one defect management engine coupled to said at least one memory, said at least one defect management engine comprising: a memory array comprising a plurality of groups of data cells and address cells said cells, in each of said groups of data cells and address cells respectively storing data and addresses; means for accessing at least one of said plurality of groups of data cells and address cells; means for detecting an address match condition for each of said accessed groups, wherein the address of said accessed group matches an inputted address; and means for outputting data from said accessed group of data cells when said address match condition is detected.

44. The defect management system as recited in claim 43 further comprising at least one defect management engine chip coupled to each of said chips comprising said at least one memory and to said at least one non-volatile random access memory.

45. A method of managing defects comprising the steps of:
   configuring a memory array in a plurality of groups of data cells and address cells, said cells in each of said groups of data cells and address cells respectively storing data and addresses;
   accessing at least one of said plurality of groups of data cells and address cells;
   detecting an address match condition for each of said accessed groups, wherein the address of said accessed group matches one of a plurality of inputted addresses; and outputting data from said accessed group of data cells and address cells when said address match condition is detected.

46. The method of managing defects as recited in claim 45 further comprising the step of overriding with new data said accessed group of data cells when said address match condition is detected.

47. The method of managing defects as recited in claim 45, wherein said data cells and said address cells are selected from the group consisting of DRAM cells, EEPROM cells and Flash memory cells, and from any combination of said cells.

48. The method of managing defects as recited in claim 45, wherein said data cells and said address cells are of a same cell type.

49. The method of managing defects as recited in claim 45, wherein said data cells and said address cells are of a different cell type.

50. The method of managing defects as recited in claim 45, wherein the addresses stored in said address cells are non-volatile.

51. The method of managing defects as recited in claim 45 further comprising means for programming said addresses stored in at least one of said address cells.

52. A method of managing defects comprising the steps of:

configuring a memory array into a plurality of groups of redundancy data cells and redundancy address cells, said cells respectively storing redundancy data and redundancy addresses;

accessing at least one of said plurality of groups of redundancy data cells and redundancy address cells;

detecting a redundancy address match condition for each of said accessed groups, wherein the redundancy address of said accessed group of redundancy address cells matches one of a plurality of inputted addresses; and outputting redundancy data from said accessed group of redundancy data cells and redundancy address cells when said redundancy address match condition is detected.

53. The defect management engine as recited in claim 52 further comprising the step of overriding with new data said accessed group of redundancy data cells when said redundancy address match condition is detected.

* * * * *